United States Patent [19]

Pavio, Jr. et al.

[11] Patent Number: 4,768,000
[45] Date of Patent: Aug. 30, 1988

[54] MONOLITHIC DOUBLE BALANCED SINGLE SIDEBAND MODULATOR

[75] Inventors: Anthony M. Pavio, Jr.; Scott D. Thompson, both of Collin, Tex.

[73] Assignee: Texas Instruments Incorporated, Dallas, Tex.

[21] Appl. No.: 37,770

[22] Filed: Apr. 13, 1987

[51] Int. Cl.⁴ .......................... H03C 1/42; H03C 1/60
[52] U.S. Cl. .................................. 332/31 T; 332/45; 307/529
[58] Field of Search .......... 332/45, 31 T, 44; 455/47, 109, 333, 46; 375/43, 61; 307/529, 304; 328/160

[56] References Cited

U.S. PATENT DOCUMENTS 4,590,433 5/1986 Kusakabe ..................... 332/31 T

FOREIGN PATENT DOCUMENTS 54-100617 8/1979 Japan ........................... 455/333
60-7210 1/1985 Japan ........................... 455/333

Primary Examiner—Siegfried H. Grimm
Attorney, Agent, or Firm—Melvin Sharp; Richard K. Robinson; René Grossman

[57] ABSTRACT

A modulator comprising two differential FET pairs, each pair having a current generator feeding the source electrodes thereof, a voltage source being coupled between the drain electrodes of each pair and the current generator. A low frequency signal is applied to one of the gate electrodes of each pair, ninety degrees out of phase with each other and a high frequency signal is applied to the other of the gate electrodes of each pair, ninety degrees out of phase with each other. The result is that all of the generated frequencies except one side band is cancelled at the drain electrodes of the pairs. The particular side band recovered is determined by the direction of the ninety degree phase shift between the signals.

20 Claims, 4 Drawing Sheets

MONOLITHIC SSB MODULATOR

MONOLITHIC SSB MODULATOR

MODULATOR PHASOR DIAGRAM

DUAL GATE SSB MODULATOR

DISCRETE SSB MODULATOR

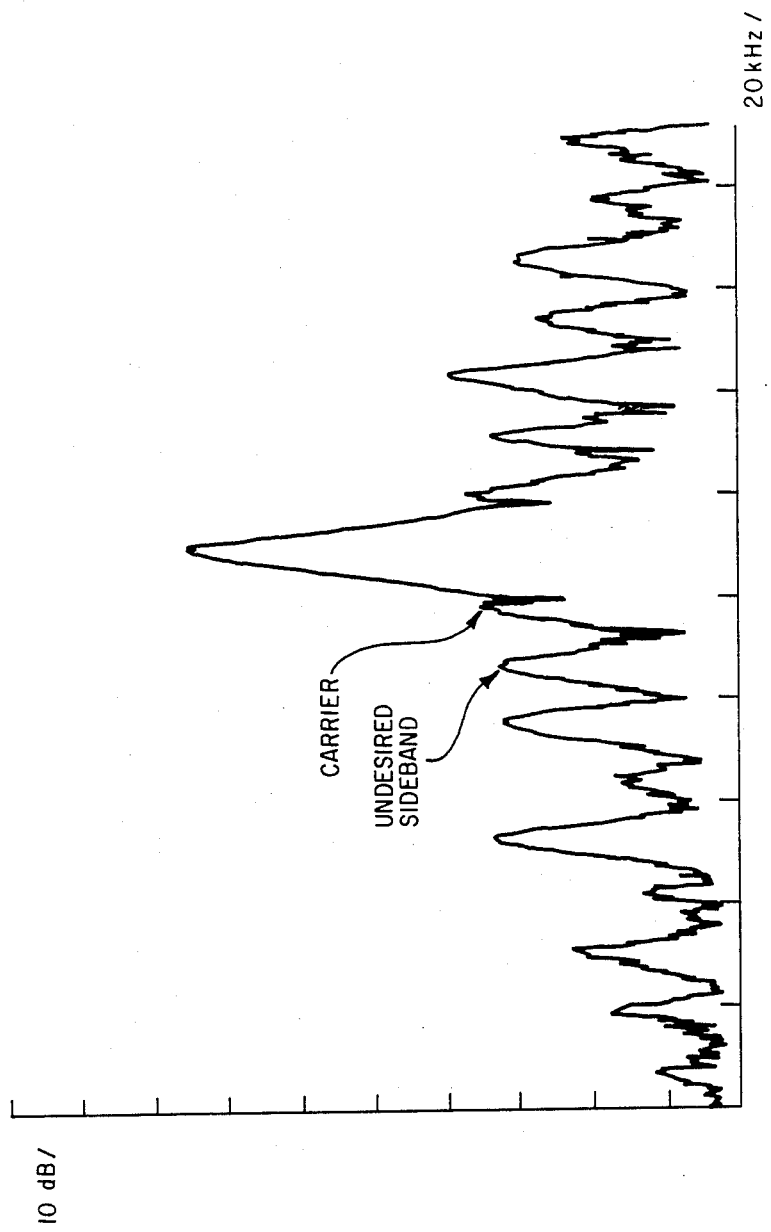

MONOLITHIC DOUBLE BALANCED SINGLE SIDEBAND MODULATOR

BACKGROUND OF THE INVENTION

1. Field of the Invention

This invention relates to a single sideband modulator capable of fabrication on a single semiconductor chip.

2. Brief Description of the Prior Art

Single sideband (SSB) modulators have been employed in numerous communication, radar and ECM systems for many years. Most modern systems employ solid state modulators which have been designed using both active (FET, BJT, etc.) and passive (diodes) components in a variety of circuit configurations, ranging from multiple single balanced structures to double-double balanced structures. In all practical applications, unwanted sideband suppression and carrier rejection are prime performance considerations.

With the continual miniaturization of circuits, it becomes desirable to provide single sideband modulators which are capable of fabrication on a single semiconductor chip and, preferably, along with other circuit components on the same chip and which are also capable of operation in the microwave range. This requires that all of the components of the modulator be capable of fabrication on a single chip and that associated circuitry be compatible therewith, i.e., be capable of fabrication on the same chip. It is also necessary that there be no baluns on the chip in order that a monolithic configuration be attainable. In addition, when operation is at microwave frequencies, it is readily apparent that considerable improvement in circuit performance is attainable due to reduced size and superior device matching in such miniaturized monolithic circuits.

It is well known that when a pair of signals, as, for example, a carrier of frequency f1 and a modulating signal of frequency f2 are mixed in a mixer or modulator, the output thereof is generally a combination of f1, f2, f1+f2 and f1−f2. The sum and difference signals are referred to as the side bands. In single sideband transmission, it is desired to operate with only one of the sum (f1+f2) or difference (f1−f2) signals.

In the prior art, in order to obtain single side band, there is a requirement of at least two mixers that are separate and there is the outside balance to obtain the proper phase relationships whereby one side band can be cancelled.

A further problem is encountered when the frequency of the sidebands is only slightly different from that of the carrier frequency. It is readily apparent that, as the frequency of the sidebands approaches the frequency of the carrier, the ability to filter out the sideband signal relative to the carrier signal or vice versa, using standard filter circuits, becomes extremely difficult. In the case of, for example, a 7 gigahertz carrier with a sideband removed therefrom by 20 kilohertz, electronic filtering using filter circuits becomes virtually impossible. Prior art circuits therefrom have required the use of a balun with each mixer as well as external circuitry to obtain the single sideband. It is therefore necessary that other means be used to provide the required filtering action.

SUMMARY OF THE INVENTION

In accordance with the present invention, there is provided a circuit which meets the above described criteria and has a minimum number of parts and is capable of self cancelling the carrier and one of the sidebands.

Briefly, an approach to designing SSB mixers and modulators using GaAs FET pairs rather than schottky barrier diodes has been selected due to circuit flexibility and performance considerations. The isolation of spectral products and circuit compactness are optimized by employing single or dual gate FETs as the nonlinear modulator. The differential pair characteristics of a pair of differential amplifiers is used with the phases carefully chosen so that everything cancels at the output node except the desired angle side band. The differential pair gives a perfect 180 degree phase shift, thereby essentially providing an internal balun. Two ninety degree signals are required, one, for example, being provided by a Lange coupler, the other being derived from a sine-cosine relationship. The desired particular one of the two sidebands can be selected by shifting the phase of the signal on one of the audio lines by 180 degrees, by going from a sine/cosine to a sine/−cosine relation. In accordance with the present invention, the problem of filtering as noted hereinabove is resolved by cancelling the unwanted signal in the modulator circuit itself, thereby eliminating the requirement for additional filtering circuitry, such as baluns and the like.

In accordance with a first embodiment of the invention, two GaAs FET differential amplifiers are connected as a double-balanced mixer. By applying modulation and carrier frequencies to the FET gates in quadrature, only one sideband voltage will appear at the drain terminal of the modulator. The sideband is selected by changing the phase of either signal by 180 degrees. Since both FET pairs are balanced and are driven by the carrier and modulation signals at opposite FETs, the circuit exhibits complete isolation, thus reducing the number of required non-linear elements to four. Prior art approaches employ two double-balanced modulators with eight nonlinear elements to achieve comparable performance.

At frequencies where the carrier and modulation frequencies cannot be separated at the FET gates by simple filter networks, in accordance with a second embodiment of the invention, dual gate FETs are substituted for the single gate devices. The carrier and modulation signals are then applied to different gates. Thus, any combination of frequencies can be employed to satisfy various system and component requirements.

BRIEF DESCRIPTION OF THE DRAWINGS

FIG. 5 is a graph showing sideband and carrier suppression for the circuit of FIG. 4.

DESCRIPTION OF THE PREFERRED EMBODIMENTS

Figures 1A, 1B:
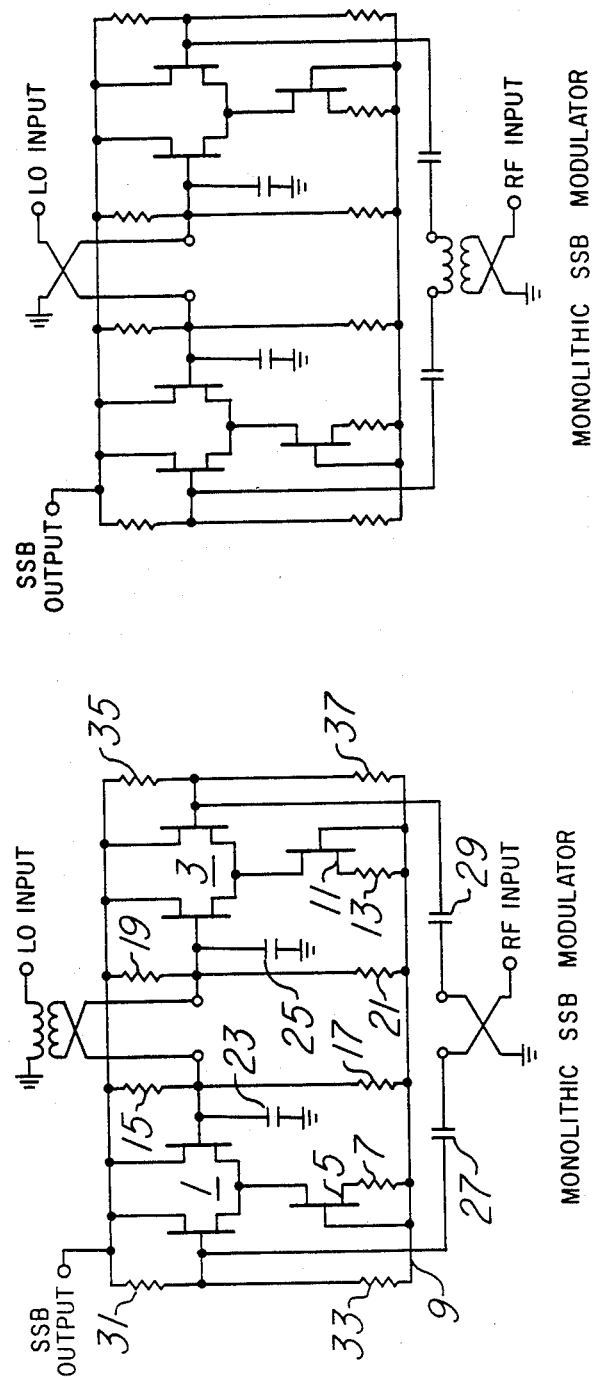
FIGS. 1a, 1b and 1c are circuit diagrams of monolithic single sideband modulator circuits in accordance with the present invention.
Figure 1C:
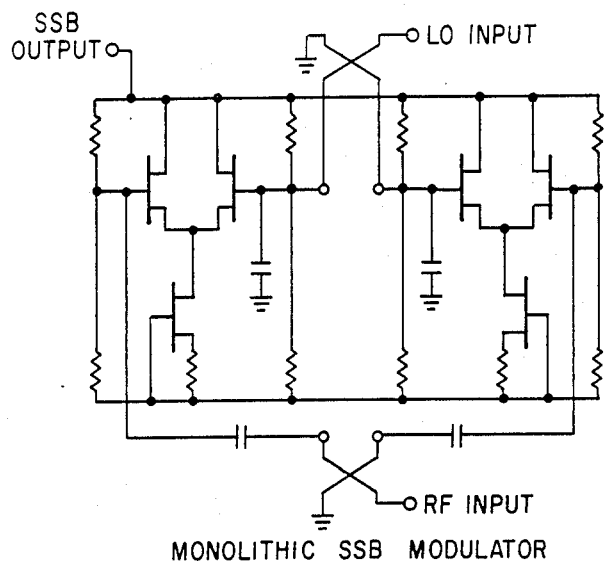

Referring first to FIGS. 1a, 1b and 1c, there are shown monolithic single sideband modulators wherein the circuits thereof are identical except that in FIG. 1a the RF input is directly coupled and the local oscillator (LO) input is transformer coupled to the circuit, in FIG. 1b the RF input is transformer coupled and the LO input is directly coupled to the circuit and in FIG. 1c both input are directly coupled to the circuit.

The circuit comprises a pair of FET differential pairs 1 and 3, preferably formed of a group III-V material, such as gallium arsenide, though this is not an absolute requirement. It is desirable that the material be the same as that used in the circuits coupled to the modulator to allow easy fabrication of monolithic circuits with the modulator and other circuits thereon. The source of each of the FETs of pair 1 is coupled through an FET transistor 5 and resistor 7 to a reference line 9. Likewise, the source of each of the FETs of pair 3 is coupled through an FET transistor 11 and resistor 13 to the reference line 9. The gates of each of the transistors 5 and 11 are coupled to reference line 9. Transistors 5 and 11 act as constant current sources. For that reason, in a monolithic implementation, it is desired to size the transistors 5 and 11 to be capable of carrying double the current of the transistors of the pairs 1 and 3 to control the amount of current that can be supplied to the pair. The LO input, which has a ground and input end, has its ground end coupled to the gate of one of the FETs of the pair 3 with the input end being coupled to the gate of one of the FETs of the pair 1. A first voltage divider composed of resistors 15 and 17 is coupled across the one gate of the pair 1 and a second voltage divider composed of resistors 19 and 21 is coupled across the one gate of the pair 3. Each of said one gate is also bypassed by a bypass capacitor 23 and 25. The RF input, which has a ground and input end, has its ground end coupled to the gate of the other of the FETs of the pair 3 with the input end being coupled to the gate of the other of the FETs of the pair 1. Each of the other of said gates is DC blocked by blocking capacitors 27 and 29. A third voltage divider composed of resistors 31 and 33 is coupled across the other gate of the pair 1 and a fourth voltage divider composed of resistors 35 and 37 is coupled across the other gate of the pair 3. Bias for the entire circuit is provided externally through the single sideband output node.

Figure 2:
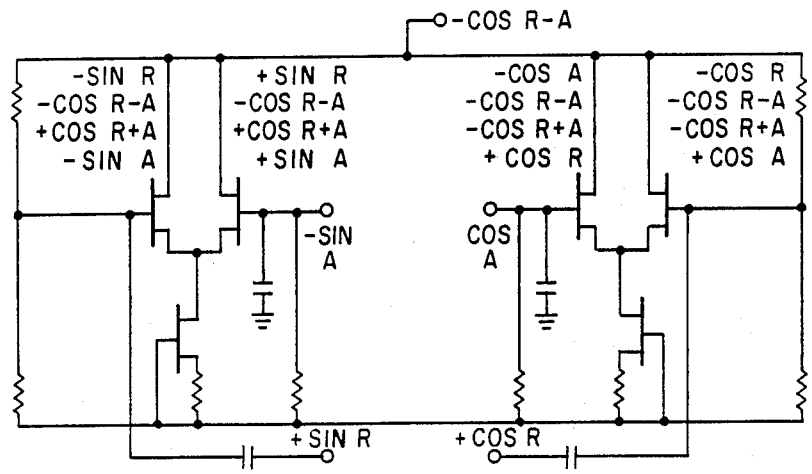
FIG. 2 is a phasor diagram for the modulators of FIGS. 1a, 1b and 1c.

By applying the modulation and carrier frequencies to the FET gates as described above in quadrature, as is shown with reference to the phasor diagram of FIG. 2, the FETs 5 and 11 operate as current sources to the FET pairs 1 and 3 and provide current to the sources of each of the transistors of said pairs. It can therefore be seen, with reference to FIG. 2, that, if a signal $+\sin R$ is applied to the gate of one of the transistors of pair 1 and a signal $-\sin A$ is applied to the gate of the other transistor of pair 1, the output of one of the transistors of pair 1 will be $-\sin R$, $-\cos R-A$, $+\cos R+A$, and $-\sin A$ whereas the output of the other of the transistors of pair 1 will be $+\sin R$, $-\cos R-A$, $+\cos R+A$ and $+\sin A$. It can be seen that the sine R and sine A terms cancel out, leaving $-2\cos R-A$ and $+2\cos R+A$.

Referring now to transistor pair 3, applying a signal $+\cos A$ to the gate of one of the transistors and a signal $+\cos R$ to the gate of the other of the transistors, the output of one of the transistors of pair 2 is $-\cos A$, $-\cos R-A$, $-\cos R+A$ and $+\cos R$ whereas the output of the other transistor of pair 2 is $-\cos R$, $-\cos R-A$, $-\cos R+A$ and $+\cos A$. It can be seen that the cosine A and cosine R terms cancel out, leaving $-2\cos R-A$ and $-2\cos R+A$.

Referring now to the output of the first and second pairs 1 and 3, the remaining outputs cosine $R+A$ cancel out, leaving a single side band output of 4 cosine $R-A$ as is shown at the output of the circuit in FIG. 2. It should be understood that, by reversing the $-\sin A$ and cosine A inputs to the transistor gates, the output signals would be the same except that the cosine $R-A$ terms would cancel and the cosine $R+A$ terms would remain, thereby providing the other sideband as the output signal. It should be understood that any manner of generating the 180 degree phase shift will provide the desired end result, the above example representing only one of the possible options. In addition to reversing the applied signals ($-\sin A$ and cosine A), the same result may be achieved by delaying one or the other of the applied signals (but not both) by 180 degrees. Thus, for example, by applying $+\sin A$ and $+\cos A$, the $R-A$ terms would cancel and the $R+A$ terms would remain. Similarly, the same result may be achieved by reversing the application of the quadrature RF signals (by "swapping" signals into the gate) or by imparting a 180 degree phase delay into either, but not both, of the RF lines leading to the gate.

It should be noted from the above example that both the audio (LO) and the RF signals have been cancelled with only one of the sidebands being retained, the particular sideband being retained being determined by the phase relationships provided as described hereinabove.

Figure 3:
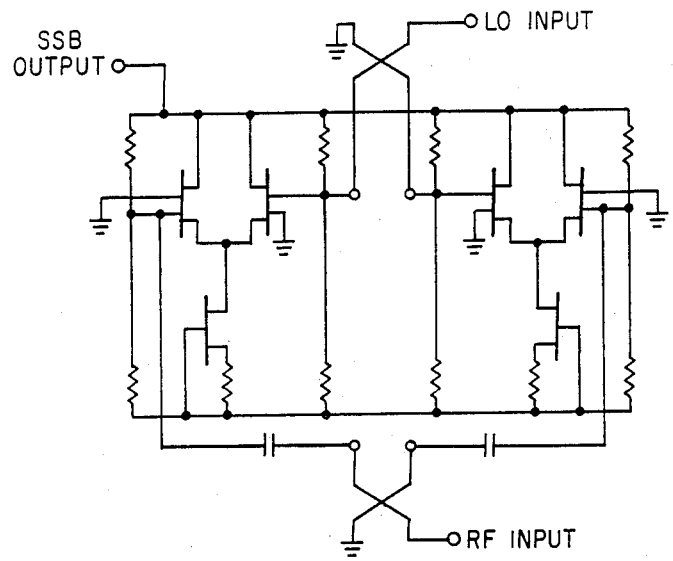
FIG. 3 is a circuit diagram of a dual gate single sideband modulator in accordance with the present invention.

Referring now to FIG. 3, there is shown a dual gate version of the embodiment of FIGS. 1a to 1c and 2. The difference here is that each of the transistors of the pairs 1 and 3 has a dual gate, one of the gates operating in the same manner as the gates of the prior embodiment whereas the additional gate is coupled to ground. This embodiment provides additional isolation and less leakage between the input terminals of each pair by having the bottom input grounded on one side and the top input grounded on the other side.

Figure 4:
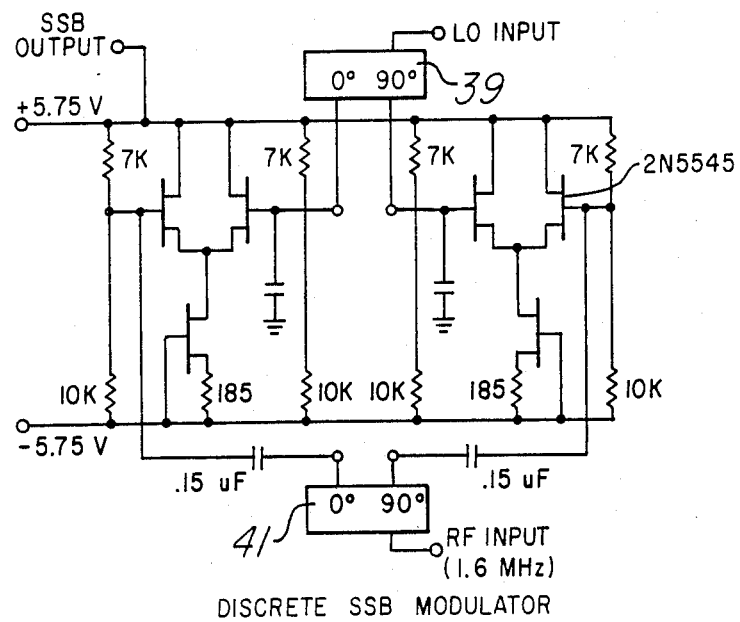
FIG. 4 is a circuit diagram of a discrete single side band modulator in accordance with the present invention which can be fabricated in a monolithic embodiment.

Referring now to FIG. 4, there is shown a specific embodiment in accordance with the present invention showing parameter values of an actual low frequency equivalent circuit using JFETs. The LO input is a 12 kilohertz signal whereas the RF input is a 1.6 megahertz signal. It should be understood that the circuit herein is capable of operation in the gigahertz region as noted hereinabove, using gallium arsenide components. The boxes 39 and 41 are circuits designed to shift the phase of the input signals by 90 degrees to provide the type of signal shown in FIG. 2. These boxes are, preferably, digital phase shifters, though other appropriate circuits could be used. The sideband chosen can be altered by reversing the leads of one phase shifter or, equivalently, shifting the phase of one of the signals or one of the phase shifters by 180 degrees to provide $-\sin$ and cosine rather than $+\sin$ and cosine signals. The performance obtained from the embodiment of FIG. 4 is shown in FIG. 5. It can be seen that the carrier and the undesired sideband have been suppressed relative to the desired sideband which is represented by the peak wave of the curve.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A modulator, comprising:
   (a) a first pair of semiconductor devices, each device having gate, source and drain electrodes, each said drain being coupled to a first predetermined reference voltage source and a current generator coupled between both source electrodes of said first pair and a second predetermined reference voltage source lower than said first voltage source,
   (b) a second pair of semiconductor devices, each device having gate, source and drain electrodes, each said drain being coupled to said first predetermined reference voltage source and a current generator coupled between both source electrodes of said second pair and said second predetermined reference voltage source,
   (c) means coupled to one of said gate electrodes of said first pair and one of said gate electrodes of said second pair to provide a signal of a first frequency to each of said one gate electrodes having a ninety degree phase difference,
   (d) means coupled to the other of said gate electrodes of said first pair and the other of said gate electrodes of said second pair to provide a signal of a second frequency to each of said other gate electrodes having a ninety degree phase difference, and
   (e) output means coupled to said first source of voltage.

2. The modulator of claim 1 wherein said first and second pairs of semiconductor devices and said output means are disposed on a single semiconductor chip.

3. The modulator of claim 1 wherein said semiconductor devices are group III-V FETs.

4. The modulator of claim 2 wherein said semiconductor devices are group III-V FETs.

5. The modulator of claim 3 wherein said semiconductor devices are formed of gallium arsenide.

6. The modulator of claim 4 wherein said semiconductor devices are formed of gallium arsenide.

7. A method of generating a single sideband signal, comprising the steps of:
   (a) providing a first pair of semiconductor devices, each device having gate, source and drain electrodes, each said drain being coupled to a first predetermined reference voltage source and a current generator coupled between both source electrodes of said first pair and a second predetermined reference voltage source lower than said first voltage source,
   (b) providing a second pair of semiconductor devices, each device having gate, source and drain electrodes, each said drain being coupled to said first predetermined reference voltage source and a current generator coupled between both source electrodes of said second pair and said second predetermined reference voltage source,
   (c) providing signals of a first frequency to one of said gate electrodes of said first pair and to one of said gate electrodes of said second pair, said signals applied to said one gate electrodes having a ninety degree phase difference,
   (d) providing signals of a second frequency to each of the other gate electrodes having a ninety degree phase difference, and
   (e) obtaining an output from said first source of voltage.

8. The method of claim 7 wherein said first and second pairs of semiconductor devices and said output means are disposed on a single semiconductor chip.

9. The method of claim 7 wherein said semiconductor devices are group III-V FETs.

10. The method of claim 8 wherein said semiconductor devices are group III-V FETs.

11. The method of claim 9 wherein said semiconductor devices are formed of gallium arsenide.

12. The method of claim 10 wherein said semiconductor devices are formed of gallium arsenide.

13. The modulator of claim 1 wherein each of said devices includes a second gate electrode coupled to said second voltage source.

14. The modulator of claim 1 wherein said first frequency is a relatively low frequency and said second frequency is a relatively high frequency.

15. The modulator of claim 4 wherein said first frequency is a relatively low frequency and said second frequency is a relatively high frequency.

16. The modulator of claim 6 wherein said first frequency is a relatively low frequency and said second frequency is a relatively high frequency.

17. The method of claim 7 wherein said first frequency is a relatively low frequency and said second frequency is a relatively high frequency.

18. The method of claim 10 wherein said first frequency is a relatively low frequency and said second frequency is a relatively high frequency.

19. The method of claim 12 wherein said first frequency is a relatively low frequency and said second frequency is a relatively high frequency.

20. The modulator of claim 13 wherein said first frequency is a relatively low frequency and said second frequency is a relatively high frequency.

* * * * *